(12) United States Patent
Yuan et al.

(10) Patent No.: US 7,803,662 B2
(45) Date of Patent: Sep. 28, 2010

(54) WARPAGE CONTROL USING A PACKAGE CARRIER ASSEMBLY

(75) Inventors: Yuan Yuan, Austin, TX (US); Sheila F. Chopin, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 305 days.

(21) Appl. No.: 11/860,125

(22) Filed: Sep. 24, 2007

(65) Prior Publication Data

US 2009/0081831 A1 Mar. 26, 2009

(51) Int. Cl.
*H01L 21/00* (2006.01)
(52) U.S. Cl. .................. 438/112; 438/106; 438/127
(58) Field of Classification Search ......... 438/124–127, 438/121, 117
See application file for complete search history.

(56) References Cited

U.S. PATENT DOCUMENTS

| | | | |
|---|---|---|---|
| 5,492,866 A | 2/1996 | Nishikawa | |
| 6,013,541 A | 1/2000 | Tan et al. | |
| 6,224,936 B1 | 5/2001 | Gochnour et al. | |
| 6,527,999 B2 | 3/2003 | Gochnour et al. | |
| 6,592,670 B1 | 7/2003 | Gochnour et al. | |
| 6,764,549 B2 | 7/2004 | Gochnour et al. | |
| 6,830,719 B2 | 12/2004 | Gochnour et al. | |
| 6,969,641 B2 | 11/2005 | Matsunami | |
| 7,172,927 B2 | 2/2007 | Yuan et al. | |
| 2005/0087909 A1 | 4/2005 | Gochnour et al. | |
| 2005/0136567 A1* | 6/2005 | Yuan et al. | 438/106 |
| 2007/0164494 A1* | 7/2007 | Chang | 269/43 |

* cited by examiner

*Primary Examiner*—Ha Tran T Nguyen
*Assistant Examiner*—Valerie Brown
(74) *Attorney, Agent, or Firm*—Kim-Marie Vo; James L. Clingan, Jr.

(57) ABSTRACT

A method for curing an encapsulant that surrounds a plurality of integrated circuits on a strip that forms a strip assembly is provided. The strip assembly is composed of units for packaging and the units each have edges defining a perimeter of the unit. The strip assembly is placed on a shelf. Pressure from deformable material or springs is applied to the strip assembly in regions of the strip. The regions are located at one of a group of locations consisting of along unit edges and centered between unit edges. Heat of sufficient temperature is applied for a sufficient duration to cure the encapsulant. The step of applying pressure continues during the application of heat for curing.

9 Claims, 3 Drawing Sheets

WARPAGE CONTROL USING A PACKAGE CARRIER ASSEMBLY

BACKGROUND

1. Field

This disclosure relates generally to semiconductor packaging, and more specifically, to warpage control of packages using a package carrier assembly.

2. Related Art

Packaged semiconductor devices are typically manufactured using various process steps, including die bonding, wire bonding, and molding. Each of these steps may be performed at a different temperature. For example, die bonding may be performed at a temperature ranging between 125 to 150 degrees Centigrade, wire bonding may be performed at a temperature ranging between 175 to 200 degrees Centigrade, and molding may be performed at a temperature ranging between 175 to 200 degrees Centigrade. When package strips, particularly, thin package strips are subjected to these temperature variations at the different processing stages, the package strips can become warped during the post mold cure stage because of mismatches in the coefficient of thermal expansion (CTE) of the various materials used to create the package strips.

Warped package strips can create several problems. For example, warped package strips can get jammed in the magazine that may be used to load or off-load the package strips into various processing stations. Warped package strips may also get jammed at the on-loader and the off-loader equipment stations. Furthermore, the warped packages may cause problems with downstream processing, as well, such as ball attachment processing. In particular, solder balls may not attach to some of the individual packages on the package strip and some balls may not be formed correctly for some of the packages on the package strip.

Accordingly, there is a need for warpage control using a package carrier assembly.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Warpage control for package strips using a package carrier assembly is provided. Warpage experienced by package strips during post mold cure may be reduced or completely eliminated. Moreover, by integrating warpage control into the post mold cure process, minimum interference to existing workflow may be caused. In one aspect, a method for curing an encapsulant surrounding a plurality of integrated circuits on a strip to form a strip assembly, wherein the strip assembly is composed of units for packaging and the units each have edges defining a perimeter of the unit is provided. The method includes placing the strip assembly on a shelf. The method further includes applying pressure to the strip assembly in regions of the strip assembly wherein the regions are located at one of a group consisting of along unit edges and centered between unit edges. The method further includes applying heat of sufficient temperature and for sufficient duration to cure the encapsulant while performing the step of applying pressure.

In another aspect, a method of forming a strip assembly using a strip is provided. The method includes attaching integrated circuits to the strip. The method further includes applying an encapsulant over the integrated circuits. The method further includes placing the strip on a shelf after the step of applying encapsulant. The method further includes applying pressure between the integrated circuits to conform the strip to the shelf. The method further includes heating the strip after commencing the step of applying pressure until the molding compound is cured, wherein the step of applying pressure continues during the step of heating. The method further includes removing the strip from the shelf after the step of heating.

In yet another aspect, a method including providing a strip having integrated circuits thereon is provided. The method further includes forming an encapsulant over the integrated circuits. The method further includes placing the strip on a shelf. The method further includes performing a step for applying pressure to the regions between the integrated circuits. The method further includes curing the molding compound during the step for applying pressure.

Figure 1:
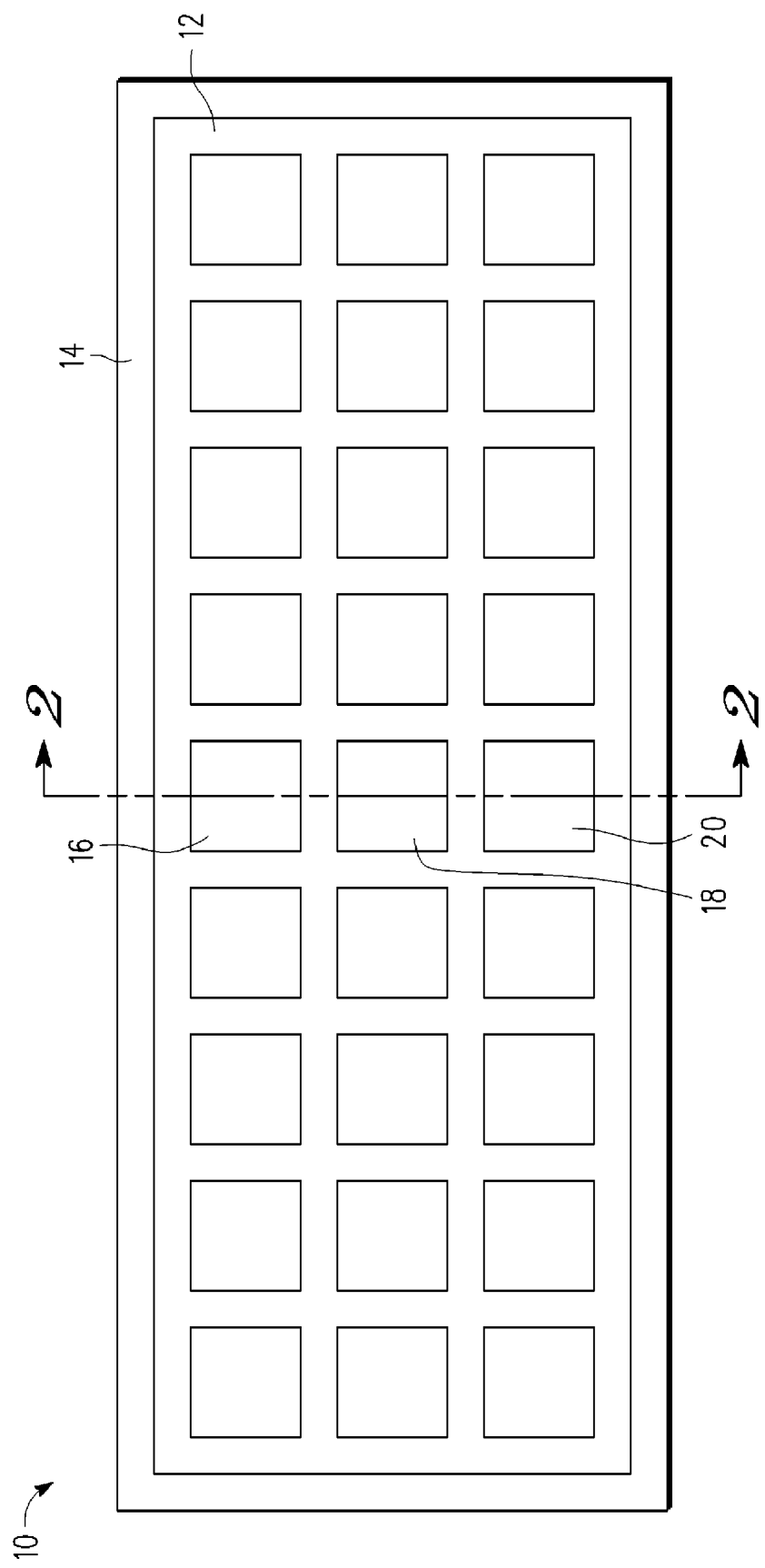
FIG. 1 shows an exemplary package strip, whose warpage may be reduced.

FIG. 1 shows an exemplary package strip assembly 10, whose warpage may be reduced. Package strip assembly 10 may be a multi-array package including multiple devices 16, 18, and 20 in form of an array overlying a package substrate 12. Package strip assembly 10 may also be a single array package. Each device (16, 18, and 20) may include at least one integrated circuit die and may be part of a standalone packaged device after singulation. Package strip assembly 10 may include a handling region 14. Package substrate 12 may be a laminate package substrate and may include multiple laminate layers. Package strip assembly may be a ball grid array strip assembly, a lead frame strip assembly, or any other suitable package strip assembly. Each device (16, 18, or 20) may include an integrated circuit die, which may be connected to package substrate 12. After physically attaching the integrated circuit die, the integrated circuit die may be electrically coupled to package substrate 12. Subsequently, encapsulant 17 may be formed over each integrated circuit die individually. Encapsulant 17 may be any type of encapsulant, such as a thermal set mold compound or a glob. Moreover, encapsulant 17 may encapsulate all of the integrated circuit dies located on package strip assembly 10 together, groups of integrated circuit dies together, or single integrated circuit dies. The package strip with encapsulated integrated circuit dies may be placed in a package carrier assembly for curing. Subsequent to completion of package strip assemblies, individual packages may be formed by singulating packages. Singulated packages may be leaded packages, such as quad-flat packs (QFPs), small outline integrated circuits (SOICs), power quad-flat no-lead packages (PQFNs), quad-flat no-lead packages (QFNs), ball grid arrays (BGAs), including package-on-packages (PoPs), chip-scale packages (CSPs), redistributed chip packages (RCPs), or any other suitable packages.

Figure 2:
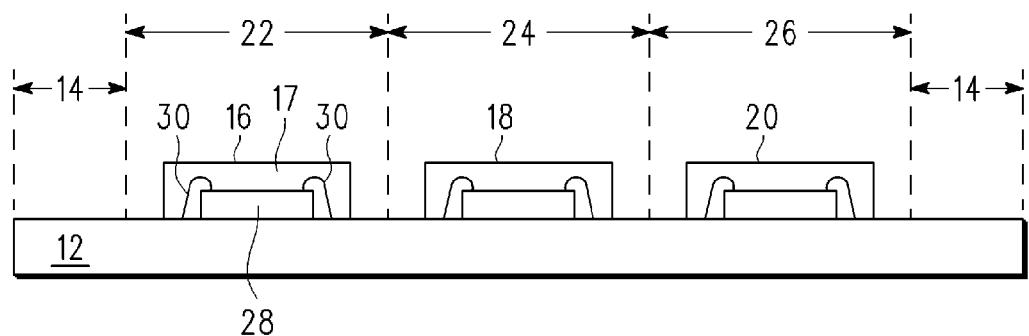
FIG. 2 shows a cross-sectional view of the exemplary package strip of FIG. 1.

FIG. 2 shows a cross-sectional view of the exemplary package strip assembly 10 of FIG. 1. As shown in FIG. 2, device 16 includes an integrated circuit die 28. Integrated circuit die 28 is connected to package substrate 12 via wire bonds 30.

Although not shown in FIG. 2, other devices 18 and 20 may also include an integrated circuit die connected to package substrate 12 via wire bonds or solder bumps, for example. Dotted lines are shown in FIG. 2 to indicate handling region 14 and units for packaging 22, 24, and 26, which may be formed as single packages after singulation. By way of example, FIG. 2 shows edges defining a perimeter of units for packaging 22, 24, and 26 by dotted lines. Even though the mold cap shown in FIG. 2 is divided by regions along the perimeter of units, the mold cap can be made to cover the edge area between the packages. The package is formed after singulation.

Figure 3:
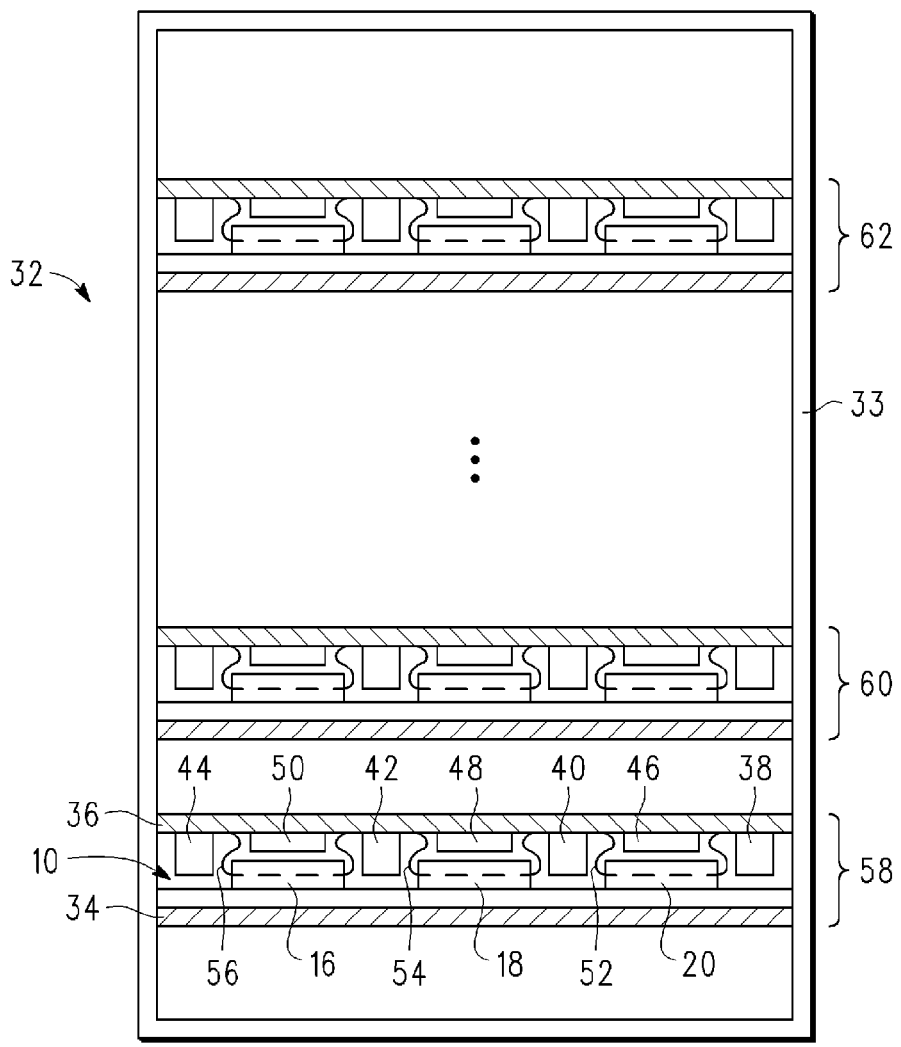
FIG. 3 shows a cross-sectional view of a package carrier assembly used for warpage control.

FIG. 3 shows a cross-sectional view of a package carrier assembly 32 used for warpage control. After molding integrated circuit dies, the molded strip package assembly may be placed in package carrier assembly 32. After placing package strip assembly 10 in package carrier assembly 32, package strip assembly 10 may be subjected to pressure in selected regions. While applying pressure to package strip assembly 10, heat may be applied to reach a sufficient temperature and for sufficient duration to ensure that the mold compound is cured. The package strip assembly 10 is then cooled down. Application of heat may be controlled at a rate sufficiently slow so that the encapsulant is relaxed in relation to package strip assembly 10. Application of pressure may be terminated after package substrate 12 has reached a desired temperature, such as room temperature.

In one embodiment, package carrier assembly 32 may be implemented as a post mold cure magazine. By way of example, package carrier assembly 32 may include a housing 33. Housing 33 may include several compression assemblies 58, 60, and 62 for holding package strip assemblies, such as package strip assembly 10. Although FIG. 3 shows only three compression assemblies, package carrier assembly 32 may include a higher or a lower number of compression assemblies. Compression assembly 58 may include a fixed shelf 34. Package strip assembly 10 may be placed on fixed shelf 34. Compression assembly 58 may further include a pressing plate 36. Pressing plate 36 may be moved up or down within housing 33 to put pressure on selected regions of package strip assembly 10. Any suitable coupling of pressing plate 36 to housing 33 may be used that allows pressing plate 36 to be moved up or down and be locked in those positions. Pressing plate 36 may include several warpage control elements, such as springs attached to it that may be used to compress a package strip assembly placed on fixed shelf 34. Although FIG. 3 shows fixed shelf 34 as having a planar surface, fixed shelf 34 may have a curved surface. By way of example, pressure of sufficient magnitude may be applied to conform a bottom side of package substrate 12 to fixed shelf 34. By way of example, pressing plate 36 may include springs running in both longitudinal and transverse direction. By way of example, springs 38, 40, 42, 44 are referred to as longitudinal springs and springs 52, 54, and 56 are referred to as transverse springs. As shown in FIG. 2, devices 16, 18, and 20 are raised compared to regions between the devices. Longitudinal springs 38, 40, 42, and 44 may be used to compress regions located between devices 16, 18, and 20 in a longitudinal direction. Similarly, transverse springs 52, 54, and 56 may be used to compress regions located between devices 16, 18, and 20 in a transverse direction. In one embodiment, only the regions between devices 16, 18, and 20 are subjected to pressure by the springs. These regions may run in both the longitudinal direction and the transverse direction. In another embodiment, both the regions between devices 16, 18, and 20 and handling region 14 may be subjected to pressure by the springs. Any material with good elasticity may be used to form the springs. For example, spring copper alloy may be used to form the springs. The compressibility of longitudinal and transverse pressing elements facilitates accommodation of height differences among various integrated circuits and the roughness of the top surfaces of the integrated circuits. In one embodiment, pressure may be applied in a region between the integrated circuits by using piecewise continuous copper spring on a pressing plate and applying the pressing plate such that the piecewise continuous copper spring is applied in the region between the integrated circuits, also referred to as the lower region.

In another embodiment, heat-resistant compressible material elements 46, 48, and 50 may be attached to pressing plate 36 to compress devices 16, 18, and 20, as well. By way of example, heat-resistant compressible material elements 46, 48, and 50 may be used to apply pressure to the top surface of devices 16, 18, and 20. Any compressible elastic material, such as heat-resistant foam or springs may be used to form heat-resistant compressible material elements 46, 48, and 50. The compressibility of heat-resistant compressible material elements 46, 48, and 50 makes it easy to absorb height differences among various integrated circuits and the roughness of the top surfaces of the strip or the molded packages. In one embodiment, the heat-resistant compressible material elements directly touch a top surface of the molded packages located on the package strip assembly to make the package strip assembly conform to the shelf on which it is placed.

Figure 4:
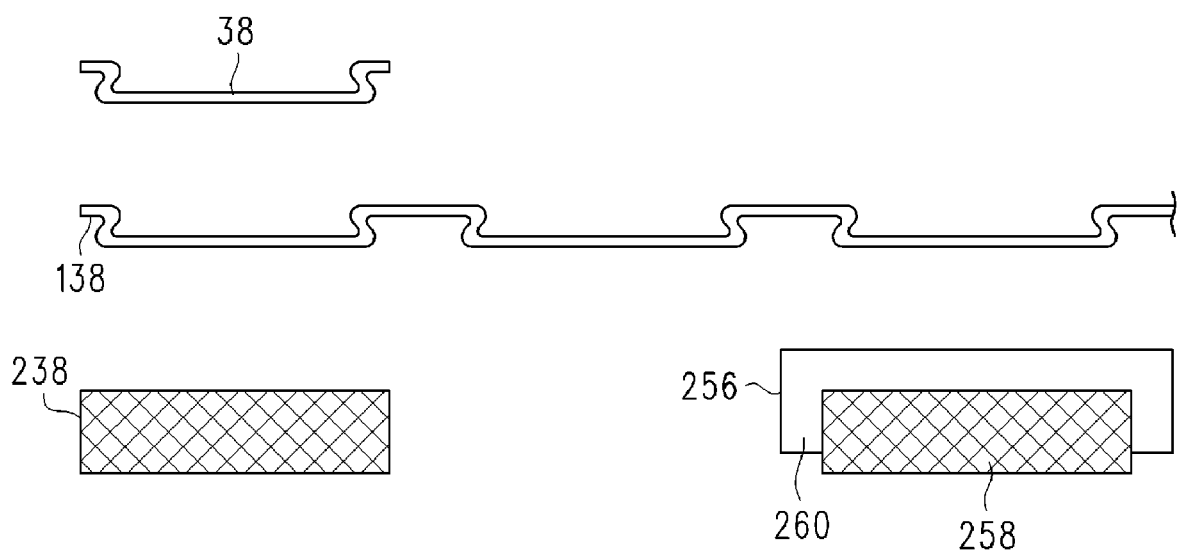
FIG. 4 shows exemplary warpage control elements for use in the package carrier assembly of FIG. 3.

FIG. 4 shows exemplary warpage control elements for use in a package carrier assembly 32 of FIG. 3. A longitudinal spring 38 used as a warpage control spring may have the shape shown in FIG. 4. Multiple longitudinal springs may be used to compress selected portion of package strip assembly 10. Alternatively, longitudinal spring 138 used as a warpage control spring may have the shape shown in FIG. 4. Instead of a spring, a structure 238 made of heat-resistant compressible material, such as heat-resistant foam may be used. By way of example, heat-resistant compressible structure 256 may be formed as shown in FIG. 4. Heat-resistant compressible structure 256 may be used in lieu of compressible material element 48 (FIG. 2). Heat-resistant compressive structure 256 may include a housing 260. Housing 260 may further include a heat-resistant compressible material element 258. Although FIG. 4 shows specific structures for the various elements used for warpage control, other structures may be used consistent with other embodiments of the invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for curing an encapsulant surrounding integrated circuits on a strip to form a strip assembly, wherein the strip assembly is composed of units for packaging and the units each have edges defining a perimeter of the unit, comprising:
    placing the strip assembly on a shelf;
    applying pressure to the strip assembly in regions of the strip assembly wherein the regions are located at one of a group consisting of along unit edges and centered between unit edges; and
    applying heat of sufficient temperature and for sufficient duration to cure the encapsulant while performing the step of applying pressure, wherein the encapsulant has raised molded areas around the integrated circuits with lower regions between the raised molded areas, wherein the step of applying pressure comprises applying the pressure in the lower regions with springs.

2. The method of claim 1, wherein the step of applying pressure is further characterized as applying pressure of sufficient magnitude to conform a bottom side of the strip to the shelf.

3. The method of claim 1 further comprising:
    removing the heat while continuing performing the step of applying pressure.

4. The method of claim 3, further comprising:
    terminating the step of applying pressure after the strip has reached room temperature.

5. The method of claim 3, wherein the step of removing the heat is performed at a rate sufficiently slow so that the encapsulant is relaxed in relation to the strip.

6. The method of claim 1, wherein the step of applying the pressure in the lower regions with springs comprises forming piecewise continuous copper spring in regions on a pressing plate and applying the pressing plate such that the piecewise continuous copper spring is applied in the lower regions.

7. The method of claim 1, wherein the step of applying pressure comprises:
    providing a pressing plate;
    forming springs on the pressing plate aligned to regions between the integrated circuits;
    forming compressible layers on the pressing plate aligned to the integrated circuits; and
    applying the pressing plate to a top side of the strip assembly whereby the springs apply pressure to strip between the integrated circuits and to a top surface of the integrated circuits.

8. The method of claim 1, wherein the step of applying pressure is further characterized by applying pressure over the units.

9. The method of claim 8, wherein the step of applying pressure is further characterized by applying pressure over the units using a compressible layer.

* * * * *